United States Patent [19]
Chung et al.

[11] Patent Number: 5,940,710
[45] Date of Patent: Aug. 17, 1999

[54] METHOD FOR FABRICATING METAL OXIDE SEMICONDUCTOR FIELD EFFECT TRANSISTOR

[75] Inventors: In Sool Chung; Young Tag Woo, both of Kyoungki-do, Rep. of Korea

[73] Assignee: Hyundai Electronics Industries Co., Ltd., Kyoungki-do, Rep. of Korea

[21] Appl. No.: 08/610,887

[22] Filed: Mar. 5, 1996

[30]     Foreign Application Priority Data

Mar. 8, 1995 [KR]   Rep. of Korea .......................... 95-4718

[51] Int. Cl.⁶ .................................................. H01L 21/336
[52] U.S. Cl. .......................... 438/305; 438/529; 438/639; 438/702; 438/231
[58] Field of Search ..................................... 438/301, 303, 438/231, 305, 294, 297, 702, 514, 519, 527, 529, 225, 229, 438, 439, 639, 647, 696, 700, 758, FOR 199, FOR 204; 257/408; 148/DIG. 50, DIG. 82

[56]                References Cited

U.S. PATENT DOCUMENTS 5,006,477   4/1991   Farb ......................................... 438/305
5,538,914   7/1996   Chiu et al. ............................... 438/305
5,656,520   8/1997   Watanabe ................................ 438/305

*Primary Examiner*—Savitri Mulpuri
*Attorney, Agent, or Firm*—Nath & Associates; Gary M. Nath; Harold L. Novick

[57]                ABSTRACT

A method for fabricating a metal oxide semiconductor field effect transistor wherein source/drain junctions are formed by depositing and etching an oxide film having a desired thickness prior to the formation of a pocket region carried out by a pocket ion implantation after forming a gate oxide film and gate electrode on a channel region formed by implanting impurity ions in a silicon substrate. The pocket region is formed by impurity ions in source/drain regions exposed by etching the oxide film. Accordingly, it is possible to reduce the thermal budget applied to the source/drain junctions. As a result, the lateral diffusion of the impurity ions implanted in the source/drain junctions can be suppressed as much as possible. That is, the transistor fabricated in accordance with the present invention has a channel length longer than that obtained in accordance with the prior art. Accordingly, the transistor can have a highly compact or densely integrated size. Since source/drain electrodes are separately formed from each other in accordance with the present invention, the insulation between the source/drain electrodes can be effectively obtained.

4 Claims, 7 Drawing Sheets

METHOD FOR FABRICATING METAL OXIDE SEMICONDUCTOR FIELD EFFECT TRANSISTOR

BACKGROUND OF THE INVENTION

1. Field of the Invention

The present invention relates to a method for fabricating a metal oxide semiconductor field effect transistor (MOSFET), and more particularly to a method for fabricating a MOSFET, wherein a source/drain electrode is formed by selectively etching an oxide film to expose a region where source/drain junctions will be formed, and then implanting impurity ions in the exposed region.

2. Description of the Prior Art

FIGS. 1A to 1D illustrate sequential steps of a conventional method for fabricating a P-channel MOSFET, respectively. In accordance with this method, a first-conduction type silicon substrate 1 is first prepared, and then a well is formed in the upper portion of the silicon substrate 1 using second-conduction type impurity ions which are different from the first-conduction type, as shown in FIG. 1A. The first-conduction type impurity ions are then implanted in a portion of the well corresponding to an active region. By these ion implantation steps, the well is provided with an element-isolating region as well as the active region. The well is also formed with a channel region 3. Thereafter, a gate oxide film 4 and a gate electrode 5 are formed on the channel region 3 in a sequential manner. The second-conduction type impurity ions are implanted in accordance with a pocket ion implanting method, thereby forming a pocket region. In this case, the amount of implanted ions is controlled as the concentration of the first-conduction type impurity ions implanted in the channel region is formed in the active region. By this control, the threshold voltage can be controlled. The punch-through characteristic may also be improved by controlling the ion implantation energy in the channel region formed in the active region.

Over the resulting structure shown in FIG. 1A, a first oxide film 6 is then deposited, as shown in FIG. 1B. Thereafter, the first oxide film 6 is etched in accordance with a dry etch method to expose the active region, as shown in FIG. 1C, At this time, oxide film spacers 7 are formed respectively on opposite side walls of the gate electrode 5 which is formed by the ion implantation. Subsequently, the exposed active region is ion-implanted with the first-conduction type impurity ions, thereby forming source/drain junctions 14 and 15.

On the resulting structure, source/drain electrodes 8 are then formed, as shown in FIG. 1D. In order to insulate the source/drain electrodes 8 from the gate electrode 5, a second oxide film 9 is deposited over the entire upper surface of the structure shown in FIG. 1C prior to the formation of the source/drain electrodes 8. The second oxide film 9 is etched using a photo mask in accordance with the dry etch method.

As mentioned above, the above-mentioned MOSFET fabricating method involves the formation of the oxide film 9 which is carried out by first forming the source/drain junctions 14 and 15 and then annealing the resulting structure under the condition that the source/drain junctions 14 and 15 are exposed. In other words, the second oxide film 9 is required for an electrical insulation between the gate electrode 5 and source/drain electrodes 8. Due to the formation of the second oxide film 9, however, the impurity ions doped in the source/drain junctions 14 and 15 are inevitably laterally diffused. As a result, the thermal budget increases while the channel length is reduced. Furthermore, boron, which exhibits a very high diffusion rate as compared to other impurities, is used for the formation of source/drain junctions in the case of P-channel MOSFETs. In this case, the annealing process greatly limits the design of P-channel MOSFETs.

In other words, the thermal budget applied to the junctions increases in the conventional fabrication of P-channel MOSFETs because the oxide film 9 is formed using the annealing process under the condition that the surfaces of the junctions 14 and 15 are exposed.

Moreover, the impurity ions doped in the source/drain junctions 14 and 15 are laterally diffused under the above-mentioned condition, thereby causing the channel to have a reduced length. As a result, it is difficult to achieve a high integration of semiconductor devices. The lateral diffusion of the impurity ions doped in the source/drain junctions 14 and 15 also increases the overlapping area between the junctions and field oxide film 2. This results in a degradation in the insulating characteristic between neighboring active regions. It is also difficult to reduce MOSFETs to a desired size.

SUMMARY OF THE INVENTION

Therefore, an object of the invention is to solve the above-mentioned problems involved in the prior art and to provide a method for fabricating a MOSFET, capable of reducing the depth of source/drain junctions by depositing an oxide film over a semiconductor substrate provided with a gate electrode, selectively etching the oxide film to expose a portion of the substrate corresponding to a region where the source/drain junctions will be formed, and then implanting impurity ions in the exposed substrate portion.

In accordance with one aspect, the present invention provides a method for fabricating a metal oxide semiconductor field effect transistor, comprising the steps of: forming an element-isolating oxide film on a silicon substrate; sequentially forming a gate oxide film and a gate electrode on the silicon substrate; depositing a first oxide film over the resulting structure obtained after the formation of the gate oxide film and gate electrode; partially etching the first oxide film and element-isolating oxide film using a contact photo mask, thereby forming a contact hole through which a desired portion of the silicon substrate and opposite side walls of the gate electrode are exposed; implanting impurity ions in the exposed portion of the silicon substrate, thereby forming a lightly doped drain region; depositing a second oxide film over the resulting structure obtained after the ion implantation; dry etching the second oxide film, thereby forming spacers comprised of the second oxide film respectively on side walls of the contact hole while exposing desired portions of the lightly doped drain region; implanting impurity ions in a high concentration in the exposed portion of the lightly doped drain region, thereby forming a source/drain region; and forming a source/drain electrode filling the contact hole.

In accordance with another aspect, the present invention provides a method for fabricating a metal oxide semiconductor field effect transistor, comprising the steps of: forming an element-isolating oxide film on a silicon substrate; sequentially forming a gate oxide film and a gate electrode on the silicon substrate; depositing a first oxide film over the resulting structure obtained after the formation of the gate oxide film and gate electrode; partially etching the first oxide film and element-isolating oxide film using a contact photo mask, thereby forming a contact hole through which a desired portion of the silicon substrate and opposite side walls of the gate electrode are exposed; implanting impurity ions in the exposed portion of the silicon substrate, thereby forming a lightly doped drain region; depositing a second oxide film over the resulting structure obtained after the ion implantation; dry etching the second oxide film, thereby forming spacers comprised of the second oxide film respectively on side walls of the contact hole while exposing desired portions of the lightly doped drain region; and forming a highly doped polysilicon layer filling the contact hole, thereby forming a source/drain electrode.

In accordance with another aspect, the present invention provides a method for fabricating a metal oxide semiconductor field effect transistor, comprising the steps of: forming an element-isolating oxide film on a silicon substrate; sequentially forming a gate oxide film and a gate electrode on the silicon substrate; depositing a first oxide film over the resulting structure obtained after the formation of the gate oxide film and gate electrode; partially etching the first oxide film and element-isolating oxide film using a first contact photo mask, thereby forming a first contact hole through which a first portion of the silicon substrate and one side wall of the gate electrode are exposed; implanting impurity ions in the exposed portion of the silicon substrate, thereby forming a lightly doped drain region; depositing a second oxide film over the resulting structure obtained after the ion implantation; dry etching the second oxide film, thereby forming spacers comprised of the second oxide film respectively on side walls of the first contact hole while exposing desired portions of the lightly doped drain region; implanting impurity ions in a high concentration in the exposed portion of the lightly doped drain region, thereby forming a first source/drain region; forming a first source/drain electrode filling the first contact hole; depositing a third oxide film over the resulting structure obtained after the formation of the first source/drain electrode; partially etching the first and third oxide films and element-isolating oxide film using a second contact photo mask, thereby forming a second contact hole through which a second portion of the silicon substrate and the other side wall of the gate electrode are exposed; implanting impurity ions in the exposed second portion of the silicon substrate, thereby forming another lightly doped drain region; depositing a fourth oxide film over the resulting structure obtained after the ion implantation for forming the other lightly doped drain region; dry etching the fourth oxide film, thereby forming spacers comprised of the fourth oxide film respectively on side walls of the second contact hole while exposing desired portions of the other lightly doped drain region; implanting impurity ions in a high concentration in the exposed portion of the other lightly doped drain region, thereby forming a second source/drain region; and forming a second source/drain electrode filling the second contact hole.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
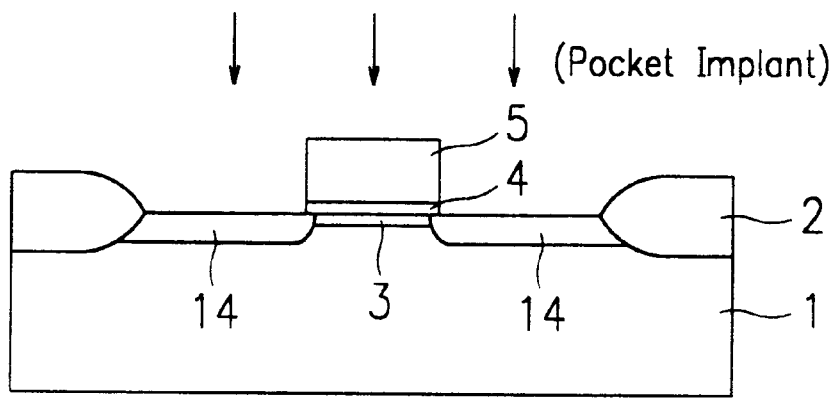
FIGS. 1A to 1D are sectional views respectively illustrating sequential steps of a conventional method for fabricating a P-channel MOSFET.
Figure 1B:
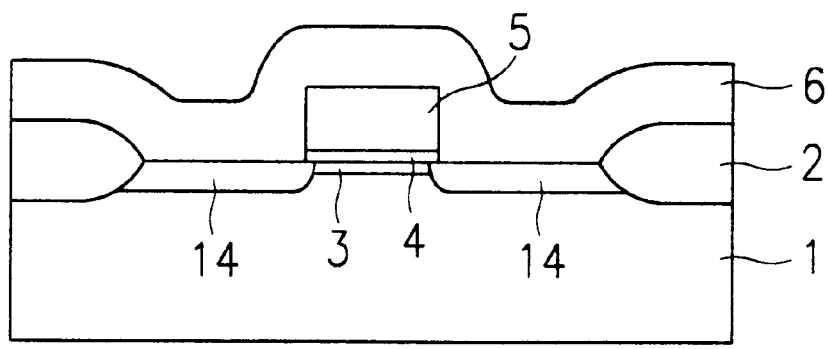
Figure 1C:
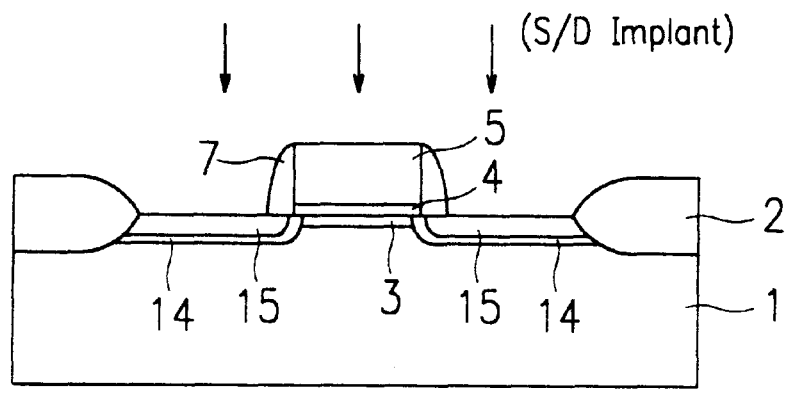
Figure 1D:
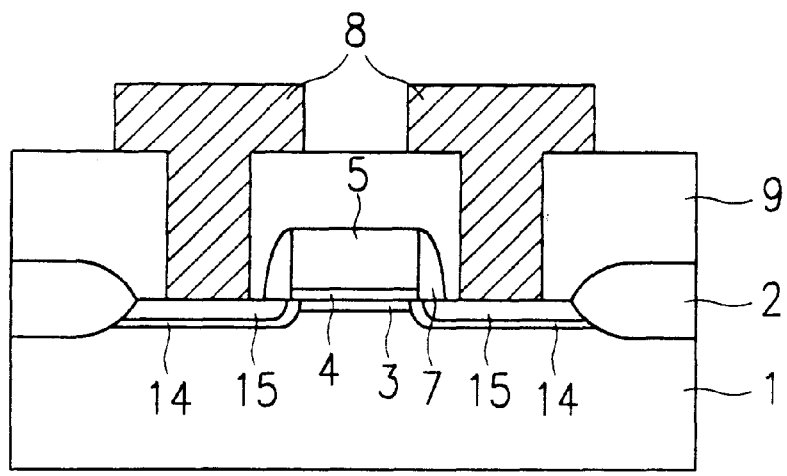

FIGS. 2A to 2E illustrate sequential steps of a method for fabricating a MOSFET in accordance with an embodiment of the present invention, respectively. In FIGS. 2A to 2E, elements respectively corresponding to those in FIGS. 1A to 1D are denoted by the same reference numerals.

Figure 2A:
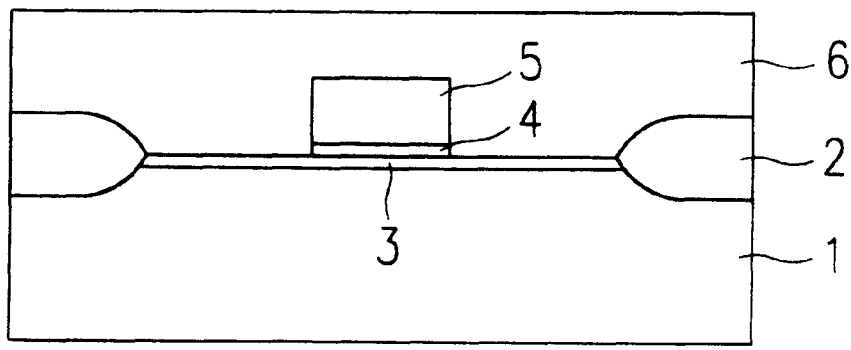
FIGS. 2A to 2E are sectional views respectively illustrating sequential steps of a method for fabricating a MOSFET in accordance with an embodiment of the present invention.

In accordance with this method, a first-conduction type silicon substrate 1 is first prepared, and then a well for the fabrication of a P-channel MOSFET is formed in the upper portion of the silicon substrate 1 using second-conduction type impurity ions, as shown in FIG. 2A. Accordingly, the well is formed with an active region and an element-isolating region. First-conduction type impurity ions are then implanted in the active region, thereby forming a channel region 3. Thereafter, a gate oxide film 4 and a gate electrode 5 are formed on the channel region 3 in a sequential manner. Over the resulting structure, a first oxide film 6 is deposited to a desired thickness.

Figure 2B:
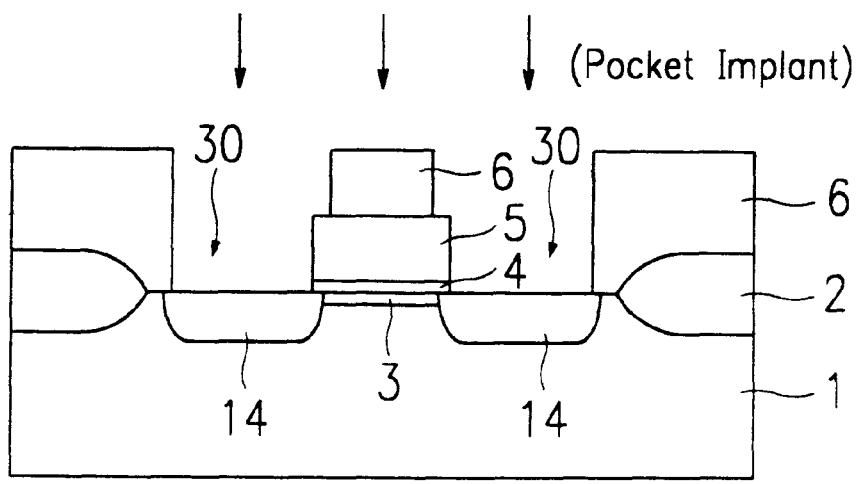

The first oxide film 6 is then etched at source/drain regions 14 and 15 using a contact photo mask, which overlaps with the gate electrode 5, in accordance with a dry etch method, thereby partially exposing the active region and gate electrode 5, as shown in FIG. 2B. A contact hole 30 is formed by the pocket implantation so that a lightly doped drain region 14 and each side of the gate electrode 5 can be exposed.

Figure 2C:
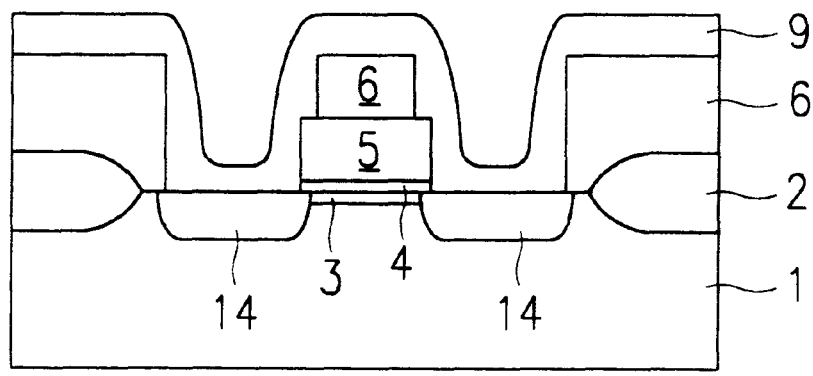

Over the resulting structure, a second oxide film 9 is subsequently deposited, as shown in FIG. 2C.

Figure 2D:
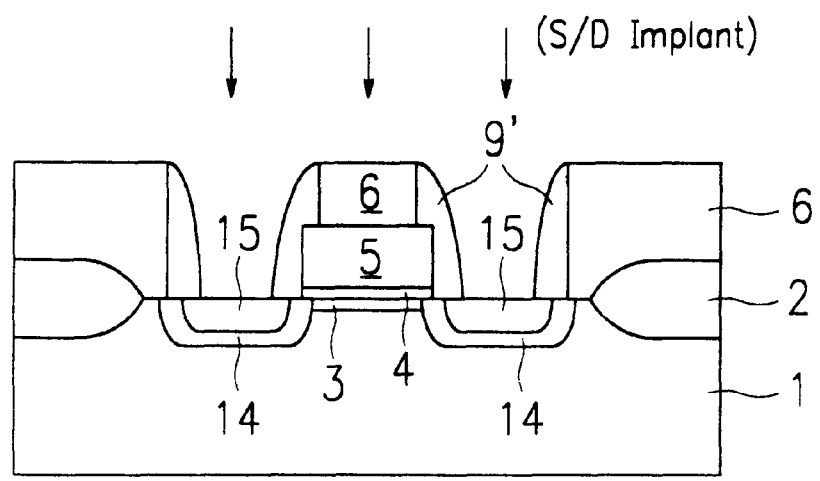

Thereafter, the second oxide film 9 is etched in accordance with the dry etch method, thereby forming oxide film spacers 9' on side walls of the source/drain regions 14 and 15, as shown in FIG. 2D. Each oxide film spacer 9' is comprised of the second oxide film 9. First-conduction type impurity ions are then implanted in the source/drain regions 14 and 15 in a concentration higher than that in the pocket ion implantation carried out at the step shown in FIG. 2C. By this ion implantation, source/drain junctions 14 and 15 are formed. The impurity used for the formation of the source/drain junctions 14 and 15 is different from that used in the pocket ion implantation. In particular, an annealing treatment may be carried out at a temperature of 700° C. or above for a desired time between the pocket ion implanting step and the source/drain impurity ion implanting step after the formation of the oxide film spacers.

Figure 2E:
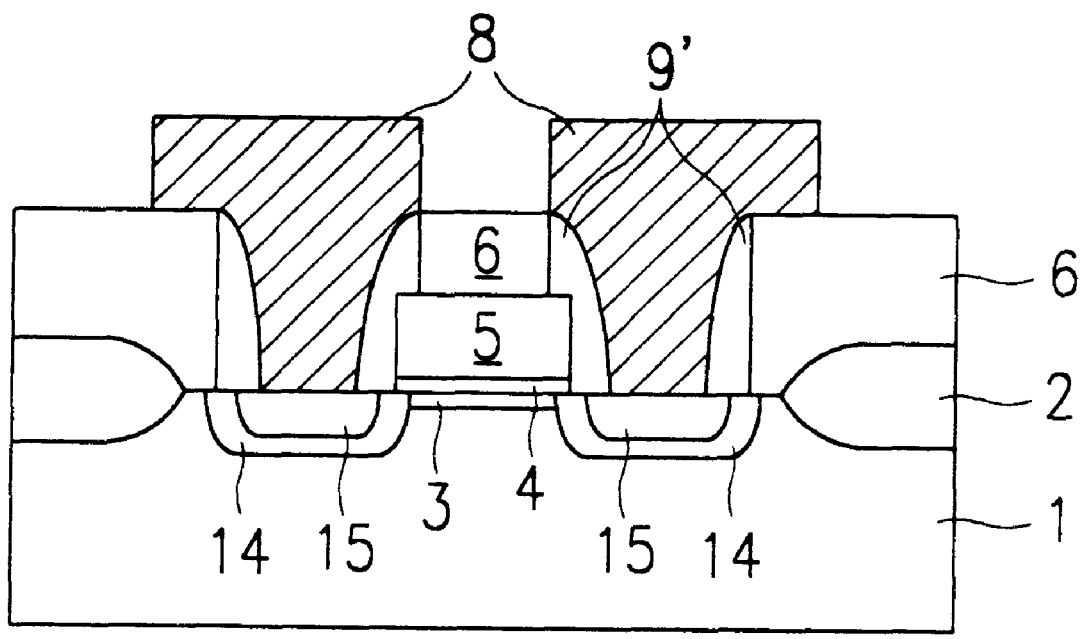

On the resulting structure, source/drain electrodes 8 are then formed such that they are in contact with the source/drain junctions 14 and 15, respectively, as shown in FIG. 2E. Where highly doped polysilicon region 15 is used to form the source/drain electrodes 8, it is possible to a secondary pocket ion implantation for forming source/drain regions 14 and 15. The pocket ion implantation is carried out in a concentration ranging from $1E17\ cm^{-3}$ to $1E19\ cm^{-3}$ whereas the source/drain impurity ion implantation is carried out in a concentration ranging from $1E19\ cm^{-3}$ to $5E21\ cm^{-3}$.

In accordance with the method according to the present invention, the source/drain junctions 14 and 15 are formed by depositing and etching the first oxide film 6 having a desired thickness prior to the formation of the pocket region carried out by the pocket ion implantation after forming the gate oxide film 4 and gate electrode 5 on the channel region formed by implanting impurity ions in the substrate 1. Accordingly, it is possible to reduce the thermal budget applied to the source/drain junctions 14 and 15. As a result, the lateral diffusion of the impurity ions implanted in the source/drain junctions 14 and 15 can be suppressed as much as possible. This means that the MOSFET fabricated in accordance with the present invention has a channel length longer than that obtained in accordance with the prior art. Accordingly, the MOSFET of the present invention can have a highly compact or densely integrated size.

In accordance with the present invention, the source/drain junctions formed in a self-aligned contact manner also has a small overlapping area with the field oxide film 2 formed for the insulation between neighboring active regions. Accordingly, it is possible to improve the insulating characteristic between neighboring active regions.

FIGS. 3A to 3D are sectional views respectively illustrating sequential steps of a method for fabricating a MOSFET in accordance with another embodiment of the present invention wherein the source and drain are separately formed in order to more effectively obtain the insulation between the source and drain electrodes of the P-channel MOSFET fabricated by the above-mentioned steps to have a compact size. In FIGS. 3A to 3D, elements respectively corresponding to those in FIGS. 2A to 2E are denoted by the same reference numerals.

Figure 3A:
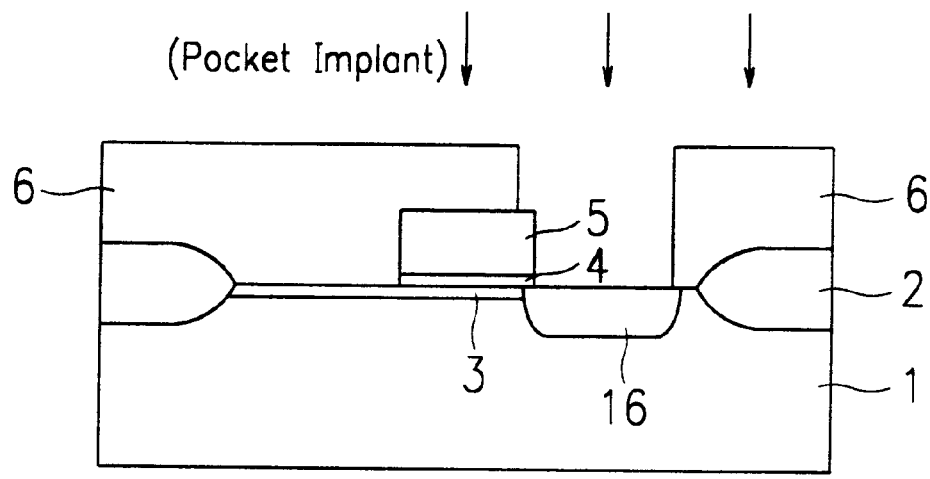
FIGS. 3A to 3D are sectional views respectively illustrating sequential steps of a method for fabricating a MOSFET in accordance with another embodiment of the present invention.

In accordance with this method, a first-conduction type silicon substrate 1 is first prepared, and then a well for the fabrication of a P-channel MOSFET is formed in the upper portion of the silicon substrate 1 using second-conduction type impurity ions, as shown in FIG. 3A. Accordingly, the well is formed with an active region and an element-isolating region. First-conduction type impurity ions are then implanted in the active region, thereby forming a channel region 3. Thereafter, a gate oxide film 4 and a gate electrode 5 are formed on the channel region 3 in a sequential manner. Over the resulting structure, a first oxide film 6 is deposited to a desired thickness. The first oxide film 6 is then etched at a source/drain region 16 using a photo mask, which overlaps with one side portion of the gate electrode 5, in accordance with a dry etch method, thereby partially exposing the active region and gate electrode 5, as shown in FIG. 2B. Thereafter, the source/drain region 16 exposed through the photo mask is implanted with second-conduction type impurity ions different from the first-conduction type, thereby forming a pocket region.

Figure 3B:
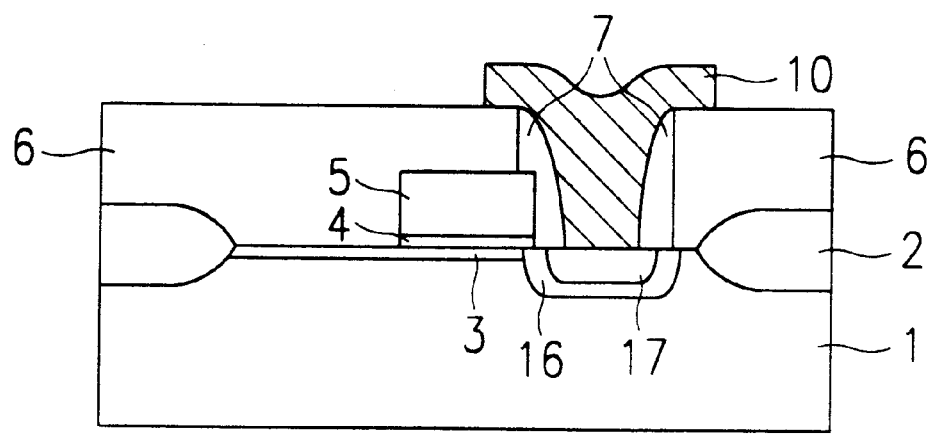

Over the resulting structure, a second oxide film (not shown) is subsequently deposited. The second oxide film is then etched in accordance with the dry etch method, thereby forming oxide film spacers 7 on side walls of the exposed source region 16, as shown in FIG. 3B. Each oxide film spacer 7 is comprised of the second oxide film. First-conduction type impurity ions are then implanted in the exposed source/drain regions 16 and 17 in a concentration higher than that in the primary pocket ion implantation. Thereafter, a source electrode 10 is formed such that it covers the source region 16.

Figure 3C:
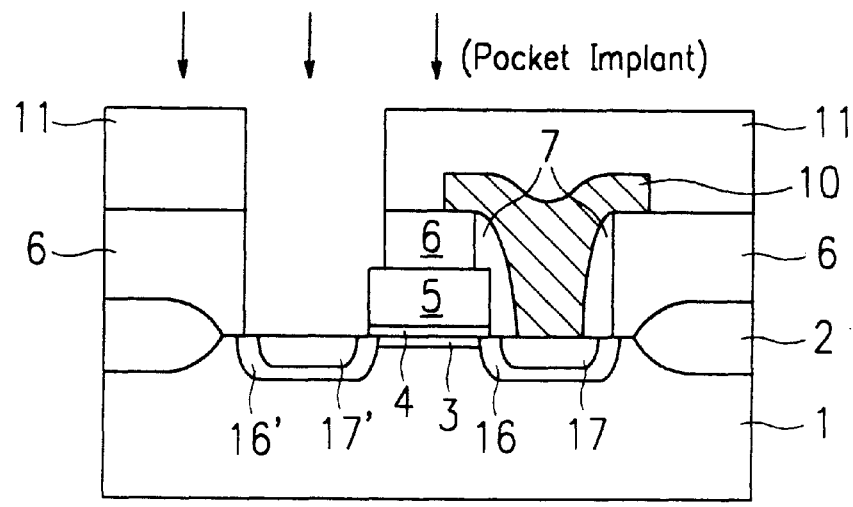

Over the resulting structure, a third oxide film 11 is then deposited, as shown in FIG. 3C. Thereafter, the third oxide film 11 and first oxide film 6 are etched at source/drain regions 16 and 17 using a photo mask, which overlaps with the other side portion of the gate electrode 5, in accordance with the dry etch method, thereby partially exposing the active region and gate electrode 5. Thereafter, a secondary pocket impurity ion implantation is carried out. That is, the source/drain regions 16 and 17 exposed through the photo mask are implanted with second-conduction type impurity ions, thereby forming a contact hole 30'.

Figure 3D:
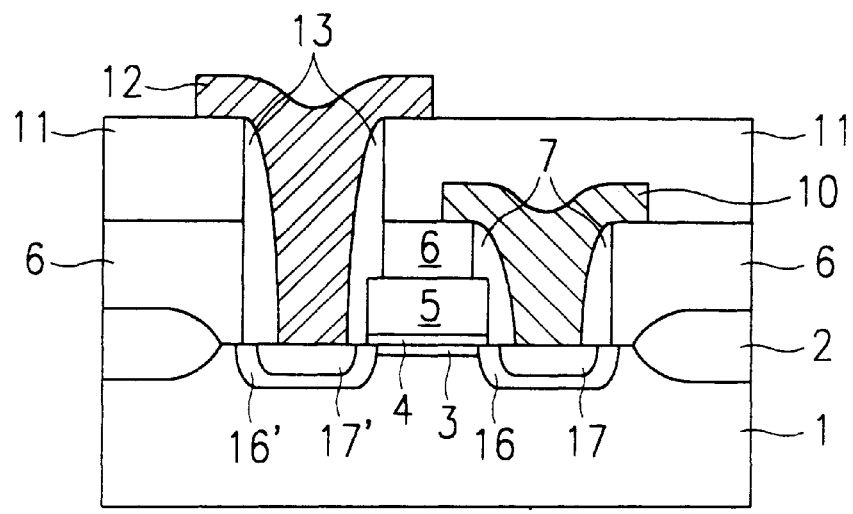

Over the resulting structure, a fourth oxide film (not shown) is then deposited. This fourth oxide film is subsequently etched in accordance with the dry etch method, thereby forming oxide film spacers 13 on side walls of the exposed drain region 17, as shown in FIG. 3D. Each oxide film spacer 13 is comprised of the fourth oxide film. First-conduction type impurity ions are then implanted in the exposed source/drain regions 16' and 17' in a concentration higher than that in the secondary pocket ion implantation. Thereafter, a drain electrode 12 is formed such that it covers the source/drain regions 16' and 17'. Thus, a MOSFET is obtained.

The source/drain electrodes 10 and 12 are made of aluminum, polysilicon or silicide. Where the source/drain electrodes are made of polysilicon, the first-conduction type material may be comprised of polysilicon.

Since the source/drain electrodes are separately formed from each other in accordance with the above embodiment of the present invention, the insulation between the source/drain electrodes can be effectively obtained. The insulation characteristic between the source/drain electrodes can be improved by virtue of the oxide film step formed at each contact between the source/drain.

As apparent from the above description, the present invention provides a MOSFET fabricating method wherein source/drain junctions are formed by depositing and etching a first oxide film having a desired thickness prior to the formation of a pocket region carried out by a pocket ion implantation after forming a gate oxide film and gate electrode on a channel region formed by implanting impurity ions in a silicon substrate. The pocket region is formed by impurity ions in source/drain regions exposed by etching the first oxide film. Accordingly, it is possible to reduce the thermal budget applied to the source/drain junctions. As a result, the lateral diffusion of the impurity ions implanted in the source/drain junctions can be suppressed as much as possible. That is, the MOSFET fabricated in accordance with the present invention has a channel length longer than that obtained in accordance with the prior art. Accordingly, the MOSFET of the present invention can have a highly compact or densely integrated size. Since source/drain electrodes are separately formed from each other in accordance with the present invention, the insulation between the source/drain electrodes can be effectively obtained.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a metal oxide semiconductor field effect transistor, comprising the steps of:

forming an element-isolating oxide film on a silicon substrate;

sequentially forming a gate oxide film and a gate electrode on the silicon substrate;

depositing a first oxide film over the resulting structure obtained after the formation of the gate oxide film and gate electrode;

partially etching the first oxide film using a first contact photo mask, thereby forming a first contact hole through which a first portion of the silicon substrate and one side wall of the gate electrode are exposed;

implanting impurity ions in the exposed portion of the silicon substrate, thereby forming a lightly doped drain region;

depositing a second oxide film over the resulting structure obtained after the ion implantation;

dry etching the second oxide film, thereby forming spacers comprised of the second oxide film respectively on side walls of the first contact hole while exposing desired portions of the lightly doped drain region;

implanting impurity ions in the exposed portion of the lightly doped drain region, thereby forming a first heavily doped source/drain region;

forming a first source/drain electrode filling the first contact hole;

depositing a third oxide film over the resulting structure obtained after the formation of the first source/drain electrode;

partially etching the first and third oxide films and element-isolating oxide film using a second contact photo mask, thereby forming a second contact hole through which a second portion of the silicon substrate and the other side wall of the gate electrode are exposed;

implanting impurity ions in the exposed second portion of the silicon substrate, thereby forming an other lightly doped drain region;

depositing fourth oxide film over the resulting structure obtained after the ion implantation for forming the other lightly doped drain region;

dry etching the fourth oxide film, thereby forming spacers comprised of the fourth oxide film respectively on side walls of the second contact hole while exposing desired portions of the other lightly doped drain region;

implanting impurity ions in the exposed portion of the other lightly doped drain region, thereby forming a second heavily doped source/drain region; and forming a second source/drain electrode filling the second contact hole.

2. The method in accordance with claim 1, wherein the source/drain electrodes are made of aluminum, polysilicon or silicide.

3. The method in accordance with claim 1, wherein in a case that the source/drain electrodes are made of polysilicon, they are comprised of a polysilicon layer doped with an impurity having the same conductivity as that of the source/drain regions.

4. The method in accordance with claim 1, wherein the impurity ion concentration of the lightly doped drain regions ranges from $1E17$ $cm^{-3}$ to $1E19$ $cm^{-3}$, and the impurity ion concentration of the heavily doped source/drain regions ranges from $1E19$ $cm^{-3}$ to $5E21$ $cm^{-3}$.

* * * * *

UNITED STATES PATENT AND TRADEMARK OFFICE
CERTIFICATE OF CORRECTION

PATENT NO. : 5,940,710
DATED : Aug. 17, 1999
INVENTOR(S) : Chung et al.

It is certified that error appears in the above-identified patent and that said Letters Patent is hereby corrected as shown below:

Col. 7, line 23, replace "depositing fourth" with

--depositing a fourth--

Col. 8, line 17, replace "the source/" with

--the heavily doped source/--

Signed and Sealed this

Eleventh Day of April, 2000

Attest:

Attesting Officer

Q. TODD DICKINSON

Director of Patents and Trademarks